United States Patent [19]
Johnston et al.

[11] Patent Number: 5,391,995
[45] Date of Patent: Feb. 21, 1995

[54] TWISTING ELECTRICAL TEST PROBE WITH CONTROLLED POINTING ACCURACY

[75] Inventors: Charles J. Johnston, Walnut; Mark A. Swart, Upland, both of Calif.

[73] Assignee: Everett Charles Technologies, Inc., Pomona, Calif.

[21] Appl. No.: 189,693

[22] Filed: Feb. 1, 1994

[51] Int. Cl.6 ............................................. G01R 1/073
[52] U.S. Cl. ...................................... 324/761; 324/757
[58] Field of Search ........................ 439/482, 824, 912; 324/761, 758, 757

[56] References Cited

U.S. PATENT DOCUMENTS

| | | | |
|---|---|---|---|
| 5,009,613 | 4/1991 | Langgard | 439/482 |
| 5,032,787 | 7/1991 | Johnston | 324/158 P |
| 5,175,493 | 12/1992 | Langgard | 324/158 P |
| 5,189,364 | 2/1993 | Kazama | 324/158 P |
| 5,276,395 | 1/1994 | Malloy | 324/761 |

*Primary Examiner*—Kenneth A. Wieder
*Assistant Examiner*—Mark Wardas
*Attorney, Agent, or Firm*—Christie, Parker & Hale

[57] ABSTRACT

A spring biased test probe for testing electrical printed circuit boards includes an elongated tubular barrel having an open end, and a compression spring within a spring seating end of the barrel, opposite from its open end. A plunger inserted in the barrel reciprocates during testing, sliding within the barrel and biased by the spring pressure. The plunger includes a forward end portion outside the barrel, a slidable tail portion that contacts the spring and slides within a barrel, and an intermediate twisted portion between the forward end and the tail portion of the plunger. The forward end of the plunger has a probe tip configured to make frictional pressure contact with the board to be tested. The intermediate portion is twisted about its axis to form a spiral with helical grooves contacted by circumferentially spaced apart crimps in the side of the barrel, adjacent the open end of the barrel. The plunger is rotated about its axis by its contact with the crimps as the plunger travels axially in the barrel. The twisted intermediate section of the plunger and the forward end of the plunger extend outside the barrel which is contained in an elongated tubular outer receptacle. The forward end of the plunger includes an elongated enlarged diameter guide bearing section between the probe tip and the twisted section of the plunger.

4 Claims, 3 Drawing Sheets

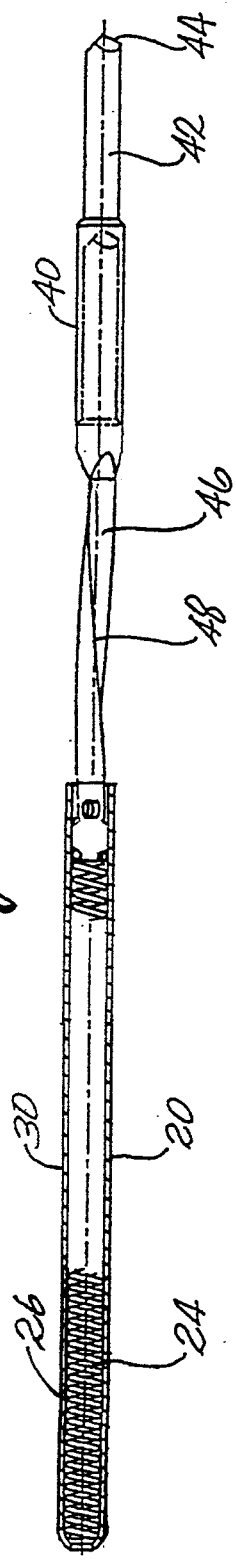
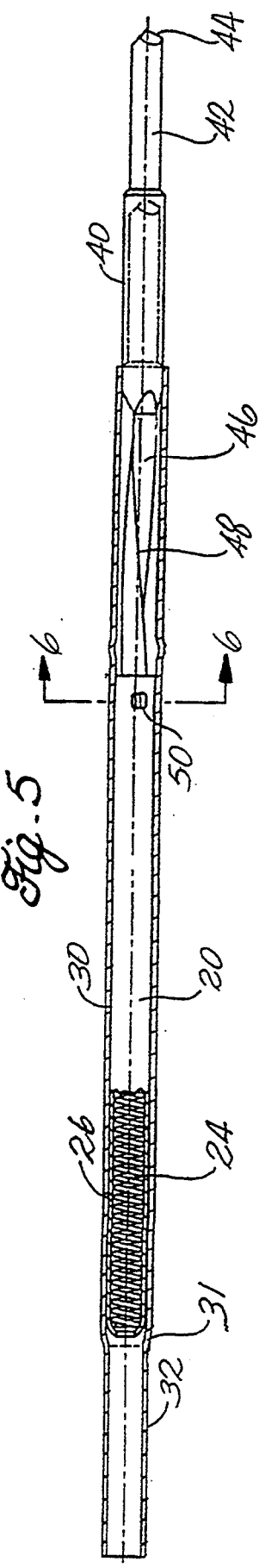
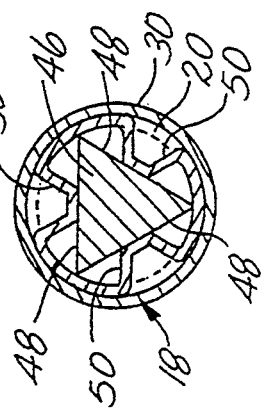

TWISTING ELECTRICAL TEST PROBE WITH CONTROLLED POINTING ACCURACY

FIELD OF THE INVENTION

This invention relates to electrical contact test probes, and more particularly, to a spring loaded test probe for use in electrical continuity testing of a variety of electrical devices. These test probes are generally used to produce contact with large numbers of test points on an electrical printed circuit board under test. The present invention, in particular, is directed to a test probe that twists about its axis when brought into contact with a test point in order to improve the reliability of the contact between the probe and the test point.

BACKGROUND OF THE INVENTION

In the automatic testing of electrical circuits, test probes of various configurations are used, depending upon such factors as the type of electrical device under test, the spacing between test points, and the like. One type of prior art test probe includes a movable plunger mounted in a tubular barrel with the probe end of the plunger extending outwardly from the barrel. A spring in the barrel supports the plunger for spring biased axial travel within the barrel. The plunger is biased outwardly a selected distance by the spring and may be biased inwardly into the barrel a selected distance under force directed against the spring. The probe plunger has a probe tip designed with various configurations for making contact with selected test points on the electrical device under test.

There are many applications in which probe end of the plunger may experience difficulty in making reliable contact with a particular circuit element or test point during the testing cycle. In order to ensure good contact during testing, prior art test probes have used certain probe tip configurations designed to enhance frictional contact when spring pressure is applied to the probe during testing. However, such an approach is not consistently the answer to the problem of making reliable contact.

Examples of instances in which good frictional contact between the test probe and the test point is desirable are where the board under test has been in a dirty environment, or where no de-fluxing was conducted after soldering. When circuit components are soldered to a board, free particles such as highly corrosive fluxes, chemicals, or other contaminants can be left on the board. Solvents have been used in the past for de-fluxing circuit boards, but solvents are being used less frequently today for environmental reasons. Therefore, many currently used circuit boards are not thoroughly cleaned before testing. In addition, spots formed on the board by the soldering process project from the board and are often covered with fluxes or oxide films. Standard test probes can have difficulty penetrating these areas of the board, producing unreliable test results.

To confront these problems, circuit boards are often tested not by standard test probes, but by probes in which the plunger is twisted about its axis during testing. This is intended to ensure that the probe tip will reliably penetrate the debris or film left on the board and make good electrical contact with the test point. In these types of test probes, the probe tip functions as a drill bit, turning on its axis as it presses against the board to cut through the debris or film that may be left on the board.

In addition to its penetrating function, such twisting test probes also must overcome additional problems. The testing of boards having free particles or debris often results in the probe contacting irregular surfaces on the board. This can produce undesired side loads on the probe plunger. A standard test probe may be able to withstand such side loading, but the process of making a twisted plunger reduces some of the plunger's effective cross-sectional area, which can reduce its ability to withstand side loads without undesired bending or flexing. Increasing the diameter of the twisted plunger section can improve the plunger's ability to withstand side loads, but increasing the diameter of the plunger is a disadvantage when test probes of smaller and smaller diameters are required for more diverse testing applications involving high density test patterns.

The demand for greater probe "pointing accuracy" also is becoming more important. There is an increasing need for the probe tip to reliably make point contact with test pads of increasingly smaller diameters within very small tolerance limits. Pointing accuracy becomes more important with more densely packed test patterns. If one or more of the probes does not align precisely with its target when the board is tested, the test results may be incorrect. Incorrectly aligned or pointed probes can miss the test point altogether. Therefore, the strike point of the probe used for testing circuit boards needs to be accurate within extremely close tolerances. This can be more of a problem for twisting test probes which, if not designed properly, can have a slight amount of wobble as the plunger twists about its axis when reciprocating in the barrel of the probe assembly.

Thus, there is a need for a twisting electrical contact test probe that can reliably penetrate debris or other contaminants on a circuit board under test, while resisting normal side loading during use in such an environment, and also while providing precisely controlled pointing accuracy.

A prior art twisting electrical test probe is disclosed in Japanese patent publication no. 60(1985)-127466, published Jul. 8, 1985. Another twisting electrical test probe having similar features is disclosed in U.S. Pat. No. 5,032,787 to Johnston, et al., assigned to the assignee of this application. These references disclose test probes in which the plunger has a twisted section with helical grooves engaged by crimps formed in the barrel between the open end of the barrel and the spring seating end of the barrel. The twisted portion of the plunger extends from inside the barrel where it contacts the crimps to the outside of the barrel where the tip of the plunger makes contact with the unit under test. An axial force directed at the plunger causes the crimps on the barrel to engage the helical grooves and twist the plunger about its axis as the plunger reciprocates in the barrel. These twisting electrical test probes can have several disadvantages. One has to do with manufacturing problems. If the crimps are too tight, the plunger can stick in the barrel, and if the crimps are too loose, the probe tip can have a tendency to wobble. Exposed twisted end sections of the plunger, if reduced in diameter to small thicknesses necessary for certain high density testing, can be too long and thin, leading to structural weakness that makes these probes impractical for high density testing.

The present invention overcomes these problems by providing a twisting electrical test probe that produces smooth operation and is well constrained, avoiding the tendency to wobble and providing high pointing accuracy.

U.S. Pat. No. 5,009,613 to Langgard, et al. discloses a twisting electrical test probe in which the plunger includes a probe tip section projecting from the open end of the barrel, a spring seating end within the barrel biased by the spring, and an intermediate twisted section with helical grooves between the spring seating end of the probe tip section of the plunger. In the probe disclosed in the '613 patent, the twisted section is contained internally within the barrel and is engaged by crimps formed in a intermediate wall portion of the barrel. The portion of the barrel between the crimps and open end on the barrel is slidably engaged by a cylindrical shaft spaced inboard from the probe tip for closing off the open end of the barrel. The sliding shaft near the open end of the barrel is said to prevent contamination from debris entering the barrel and to improve pointing accuracy.

At the probe end of the plunger, pointing accuracy is affected by a tolerance build-up in the probe assembly. In the Langgard, et al. '613 probe, there are three tolerances that affect pointing accuracy: (1) the tolerance between the barrel in the receptacle, (2) the tolerance between the receptacle and the hole in which it is mounted, and (3) the tolerance between the plunger and the barrel. These combined tolerances can lead to a tolerance build-up that can adversely affect pointing accuracy at the probe end of the plunger.

The present invention provides a twisting electrical test probe that twists about its axis to penetrate debris and other contaminants while testing printed circuit boards and the like. In addition to providing improved pointing accuracy, the probe has a controlling plunger diameter that is enlarged sufficiently to significantly increase the strength of the probe to better withstand side load forces. The probe improves upon the pointing accuracy of the prior art Japanese '466 and Johnston, et al. '787 probes described above, while also providing improved probe strength to better resist side loads when compared with the Langgard, et al. 613 probe. The probe also has a better resistance to tolerance build-up that affects pointing accuracy, when compared with the Langgard, et al. '613 probe. Tolerances affecting pointing accuracy are limited the tolerance between the receptacle and the hole in which it is mounted and the tolerance between the plunger and the receptacle where the plunger is guided by the receptacle. These improvements will be better understood with reference to the detailed description to follow.

SUMMARY OF THE INVENTION

Briefly, one embodiment of the present invention comprises a spring biased test probe for testing electrical printed circuit boards. The test probe includes an elongated tubular barrel having an open end, and a compression spring within a spring seating end of the barrel, opposite from its open end. A plunger inserted in the barrel reciprocates during testing, sliding within the barrel and biased by the spring pressure. The plunger includes a forward end portion outside the barrel, a slidable tail portion that contacts the spring and slides within a barrel, and an intermediate twisted portion between the forward end and the tail portion of the plunger. The forward end of the plunger has a probe tip configured to make frictional pressure contact with the board to be tested. The intermediate portion is twisted about its axis to form a spiral with helical grooves contacted by circumferentially spaced apart crimps in the side of the barrel. The plunger is rotated about its axis by its contact with the crimps as the plunger travels axially in the barrel. The barrel and a portion of the plunger are contained in an elongated tubular outer receptacle. The twisted intermediate portion of the plunger and the forward end of the plunger extend outside the barrel and are contained in the outer receptacle. The forward end of the plunger includes an elongated guide bearing section between the probe tip and the twisted section of the plunger. The receptacle has a fixed forward end portion extending axially beyond the open end of the barrel to receive the guide bearing section of the plunger for guiding the plunger during its reciprocating travel in the barrel, to provide controlled pointing accuracy and resistance to side loading as it twists about its axis.

The portion of the receptacle projecting beyond the open end of the barrel provides stabilized travel for the sliding end of the plunger, which improves considerably the pointing accuracy of the probe. In addition, since the controlling diameter portion of the receptacle projects beyond the open end of the barrel, its diameter (where the barrel is omitted) is enlarged so that the guide bearing section of the plunger can have a matching diameter which slides directly within the controlling enlarged diameter end portion of the receptacle. This enlarged diameter bearing section of the plunger greatly improves the strength of the plunger at the critical probe end portion of the plunger, which increases the plunger's resistance to side loads. By avoiding the combined tolerance effects of the barrel and the receptacle at the bearing section of the plunger, tolerance build-up problems also are reduced.

These and other aspects of the invention will be more fully understood by referring to the following detail description and the accompanying drawings.

BRIEF DESCRIPTION OF THE DRAWINGS

FIG. 4 is a side elevational view, partly broken away and partly in cross-section, showing components of the electrical test probe contained in a barrel of the probe prior to assembling the probe in an outer receptacle;

FIG. 5 is a side elevational view, partly broken away and partly in cross-section, showing components of the electrical test probe in its completed, assembled form; and FIG. 6 is a cross-sectional view taken on line 6—6 of FIG. 5.

DETAILED DESCRIPTION

Figure 1:
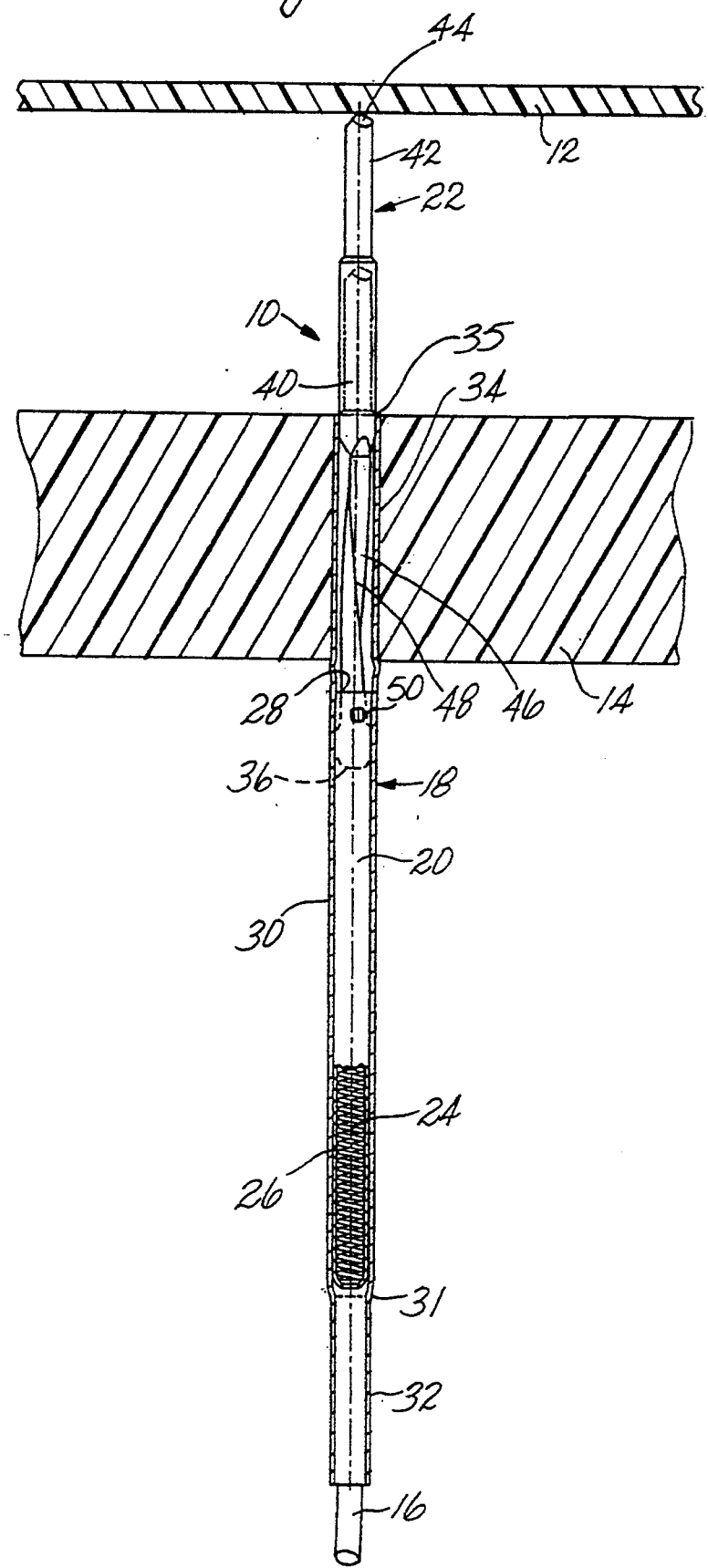
FIG. 1 is an elevational view, partly broken away and partly in cross-section, showing a twisting electrical test probe according to principles of this invention mounted in a test fixture for testing a printed circuit board.

FIGS. 1-6 illustrate one embodiment of a twisting electrical contact test probe 10 according to principles of this invention. The probe is used for making electrical contact with a test point on a unit under test, such as a printed circuit board 12. The probe is shown in use mounted in a fixed upright testing position in a rigid probe plate 14 of a test fixture. An electrical lead 16 connected to a terminal end of the test probe conducts electrical test signals to and from remote electrical testing and diagnostic equipment (not shown) familiar to those skilled in the art.

The test probe 10 includes an elongated tubular outer receptacle 18 and an elongated tubular barrel 20 contained within a portion of the receptacle. An elongated plunger 22 slides axially within portions of the barrel and the receptacle. A compression spring 24 is seated within the barrel for applying a spring force to the plunger as it reciprocates within the barrel.

The barrel 20 is of general uniform diameter extending from a spring seating end 26 of the barrel to an open end 28 of the barrel. The barrel is seated in a fixed position within an intermediate bearing seating portion 30 of the receptacle. The barrel seating portion 30 of the receptacle is stepped down in diameter at 31 to form an elongated tail section 32 of the receptacle. The tail section 32 extends away from the end of the barrel 20 and the spring 24 contained within the barrel. At the tail section of the receptacle electrical contact is made with the conductive terminal lead 16 of the probe. The receptacle also includes a probe control section 34 at the opposite end from the tail section where the receptacle extends a substantial distance beyond the open end 28 of the barrel. The receptacle has a continuous uniform outside diameter defining the maximum diameter of the probe assembly extending from the barrel seating portion 30 of the receptacle to the probe control portion 34 of the receptacle. The receptacle is seated in the probe plate 14 as shown in FIG. 1 for holding the probe in an upright position with the plunger 22 projecting away from an upper end 35 of the receptacle toward the unit under test 12.

The barrel 20 is inserted into the receptacle and retained in a fixed position in the barrel seating portion 30 of the receptacle. The barrel is held in a fixed position within the receptacle by the stop formed by the stepped down portion 31 of the receptacle diameter. The spring 24 is retained within the spring seating end 26 of the barrel which is spaced axially from the upper end 28 of the barrel. The barrel makes a tight friction fit within the receptacle with the outside diameter of the barrel being similar to the inside diameter of the receptacle.

Figure 2:
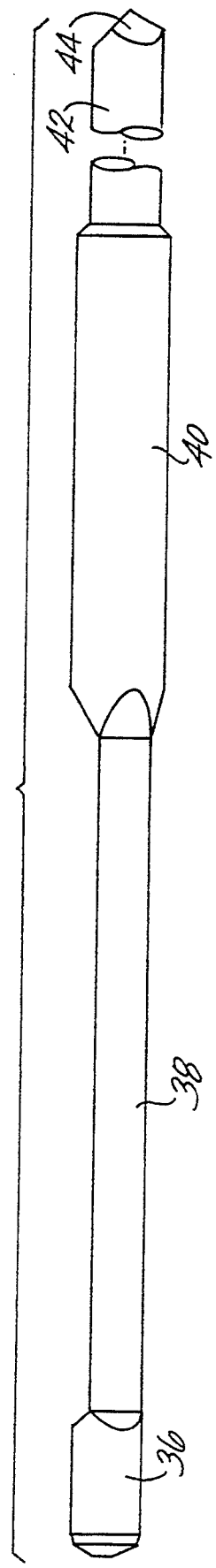
FIG. 2 is a fragmentary side elevational view showing a plunger according to this invention prior to having a portion of the plunger twisted about its axis.
Figure 3:
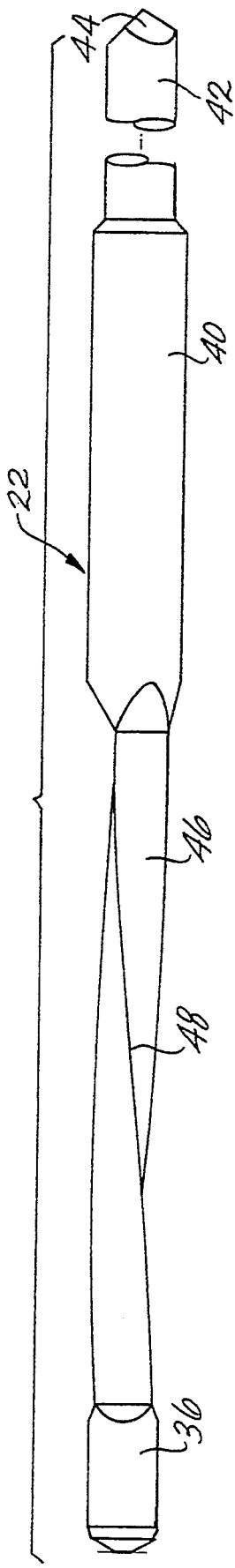
FIG. 3 is a fragmentary side elevational view showing the plunger in its completed form with a twisted helical section.

The plunger 22 is inserted into the barrel and the receptacle so as to make contact with the compression spring in the spring seating end 26 of the barrel. The plunger 22 is best illustrated in FIGS. 2 and 3. FIG. 2 shows the plunger in a form prior to twisting a portion of the plunger to form the finished twisted form of the plunger shown in FIG. 3. The plunger has a relatively short uniform diameter cylindrical tail portion 36 which is stepped down in diameter to form an elongated probe rotation control section 38 of triangular cross section. The end of the triangular rotation control section opposite from the tail portion is stepped up in diameter to form an elongated uniform diameter cylindrical guide bearing section 40 which is stepped down at its end most remote from the triangular section of the plunger to form a reduced diameter cylindrical end portion 42 which terminates a pointed tip 44. The outside diameter of the tail section 36 matches the inside diameter of the barrel and the outside diameter of the guide bearing section 40 matches the inside diameter of the receptacle. Thus, the outside diameter of the long bearing section 40 of the plunger is greater than the diameter of the tail section 36.

The form of the plunger shown in FIG. 2 illustrates the triangular section 38 with the tip of the triangle shown at the bottom and the flat opposite side of the triangle shown at the top. The triangular section 38 is formed as an equilateral triangle in cross-section and is of uniform dimension from end to end. FIG. 3 shows the probe rotation control section 38 twisted about its axis to form a twisted section 46 of the plunger which is preferably twisted at a uniform pitch angle and with a rotation of approximately 90° from end to end, as shown in FIG. 3. This forms three circumferentially spaced apart helical grooves 48 spaced uniformly around the diameter of the twisted section of the plunger. The preferred length of the twisted section 46 is about 0.252 inch.

The side wall of the barrel is crimped so the crimps engage corresponding grooves in the twisted portion of the plunger for use in rotating the plunger about its axis as the plunger reciprocates within the barrel during use. In the illustrated embodiment, three equally spaced apart crimps 50 are formed in the wall of the barrel spaced inwardly a short distance from the open end 28 of the barrel. As shown in FIG. 5, each crimp 50 is engaged with the corresponding helical groove 40 of the plunger so that side portions of the crimps contact adjacent walls of the grooves to produce an interference fit that causes the plunger to twist about its axis in response to a relative axial force between the barrel and the plunger. This arrangement leads to equal lateral forces being exerted on the plunger which are translated into uniform rotational forces when the plunger reciprocates axially within the barrel. The possibility of any lateral forces being transmitted to the plunger as it reciprocates axially, that may otherwise induce relative lateral motion of the plunger, are avoided by the guide bearing portion 40 of the plunger which provides a stabilizing effect as it travels axially within the probe control section 34 of the receptacle.

During use, the spring contact twisting probes of this invention are aligned with the circuit board as shown in FIG. 1, and each probe tip is brought into engagement with a corresponding test point on the circuit board to be tested. The compression spring exerts a continuous outward force on the probe tip urging the probe tip against the circuit board. As the plunger moves axially into the receptacle and barrel against the bias of the compression spring, the applied axial force causes the plunger to twist about its axis through the contact between the crimped portions of the barrel and the twisted portion of the plunger. This causes the plunger to twist about its axis and produce good mechanical (frictional) and electrical contact with the test point on the board. If any contaminants, particles, or the like are normally in a position to interfere with contact, the rotating test probe causes the probe tip to penetrate the debris or contaminants and produce good electrical contact. Any irregularities in the surface where contact is made with the probe tip are not translated into excessive side loading on the plunger since the plunger travel is stabilized by the enlarged diameter bearing section at the end of the plunger which is guided by the fixed probe control section of the receptacle.

In one embodiment of the invention, the barrel 20 has a length of about 0.664 inch, and the length of the probe from the probe tip to the remote end of the barrel is about 1.30 inch. The length of the probe end section 42 is about 0.163 inch, and the large diameter bearing portion 40 of the plunger has a length of about 0.192 inch.

The length of the twisted portion of the plunger is about 0.252 inch. The maximum width of the triangular section of the plunger is about 0.023 inch.

The outside diameter of the barrel is about 0.054 inch and the main outside diameter of the receptacle is about 0.068 inch. The inside diameter of the receptacle is about 0.055 inch. Thus, the outside diameter of the guide bearing portion 40 of the plunger is about 0.054 inch, which provides a high strength stabilizing end section of the plunger as it travels within the probe assembly.

Full travel of the plunger is over a length of about 0.250 inch when the plunger rotates about 90° about its axis. In normal use recommended working travel is about 0.167 inch over about 60° of plunger travel. Spring force at 0.167 inch travel is approximately four ounces and preload is about 0.82 ounce. The plunger and barrel are made of beryllium, copper, gold plated, and the spring is music wire, gold plated.

In an alternative embodiment, a twisting electrical test probe suitable for testing 0.050 inch test centers has a plunger with a main outside diameter of 0.028 inch and an outside diameter of 0.029 inch at the guide bearing portion of the plunger. Full travel of the probe is 0.190 inch, recommended working travel is 0.127 inch, and plunger rotation is 45° at 0.127 inch travel.

The enlarged diameter bearing portion 40 of the plunger provides good resistance to side loading when compared with a twisting electrical contact probe having its shaft portion of the probe tip section controlled by the barrel diameter which is typically about 0.040 inch for probes adapted for 100 mil centers. In the present invention there is a greater than 30% improvement in strength of the probe end section at the stabilizing end of the plunger for probes adapted for the same 100 mil spacing, which improves pointing accuracy and greatly resists the adverse effects of side loading.

Although, the probe is shown as a twisted electrical test probe with three spaced apart helical grooves, other embodiments, such as a square shaped plunger section controlled by four crimps formed in the barrel also can be used.

What is claimed is:

1. A spring biased test probe for testing printed circuit boards, comprising:

a elongated tubular barrel having an open end and a spring seating end, a compression spring within the spring seating end of the barrel opposite from its open end, a plunger inserted in the barrel for reciprocating within the barrel during testing of the printed circuit board, the plunger sliding within the barrel and biased by the spring, the plunger including a forward end portion outside the barrel, a slidable tail portion that contacts the spring and slides within the barrel, and an intermediate twisted portion between the forward end and the tail portion of the plunger, the forward end of the plunger having a probe tip configured to make frictional pressure contact with the board to be tested, the intermediate portion of the plunger being twisted about its axis to form a spiral with helical grooves contacted by circumferentially spaced apart crimps in the side of the barrel, the plunger rotating about its axis by its contact with the crimps as the plunger travels axially in the barrel, the twisted intermediate section of the plunger and the forward end of the plunger extending outside the barrel, and an elongated tubular outer receptacle containing the barrel, the receptacle having a fixed forward end portion extending axially beyond the open end of the barrel, the forward end of the plunger including an elongated enlarged diameter guide bearing section between the probe tip and the twisted portion of the plunger, the guide bearing section of the plunger being received for guided travel within the portion of the receptacle extending beyond the open end of the barrel, for guiding axial reciprocating travel of the plunger to produce controlled pointing accuracy and resistance to side loading as the probe twists about its axis.

2. Apparatus according to claim 1 in which the twisted section of the plunger is triangular in cross-section, and in which there are three circumferentially spaced apart crimps contacting the grooves formed by the twisted triangular section of the plunger.

3. Apparatus according to claim 1 in which the crimps in the barrel are at a generally common plane spaced inwardly from but in close proximity to the open end of the barrel.

4. Apparatus according to claim 1 in which the diameter of the receptacle at the guide bearing section of the plunger is at least as wide as the diameter of the receptacle at the twisted portion of the plunger.

* * * * *